(12) United States Patent
Hoem et al.

(10) Patent No.: US 10,798,840 B2
(45) Date of Patent: Oct. 6, 2020

(54) FOLDING DEVICE STAND FOR PORTABLE DEVICES

(71) Applicant: Micron Technology, Inc., Boise, ID (US)

(72) Inventors: Sophia Hoem, San Jose, CA (US); Wesley G. Brewer, Menlo Park, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/458,516

(22) Filed: Mar. 14, 2017

(65) Prior Publication Data

US 2017/0265319 A1 Sep. 14, 2017

Related U.S. Application Data

(60) Provisional application No. 62/308,136, filed on Mar. 14, 2016.

(51) Int. Cl.
*H05K 7/10* (2006.01)
*F16M 11/20* (2006.01)
*F16M 11/38* (2006.01)
*H05K 5/02* (2006.01)
*F16M 11/10* (2006.01)
(Continued)

(52) U.S. Cl.
CPC ............... *H05K 7/10* (2013.01); *F16M 11/10* (2013.01); *F16M 11/2021* (2013.01); *F16M 11/38* (2013.01); *F16M 13/00* (2013.01); *F16M 13/02* (2013.01); *G06F 1/1626* (2013.01); *G06F 1/1628* (2013.01); *G06F 1/1632* (2013.01); *H05K 5/0226* (2013.01); *H05K 5/0234* (2013.01); *F16M 2200/024* (2013.01)

(58) Field of Classification Search
CPC ...... H05K 7/10; H05K 5/0234; H05K 5/0226; F16M 11/2021; F16M 11/38; F16M 2200/024
See application file for complete search history.

(56) References Cited

U.S. PATENT DOCUMENTS 5,823,504 A * 10/1998 Kuwajima .............. H04M 1/12
248/685
6,786,743 B2 9/2004 Huang
(Continued)

FOREIGN PATENT DOCUMENTS

CN 102128337 A 7/2011
CN 103414804 A 11/2013
(Continued)

OTHER PUBLICATIONS

International Search Report and Written Opinion dated Jun. 23, 2017 for PCT application No. PCT/US2017/022286.
(Continued)

*Primary Examiner* — Jinhee J Lee
*Assistant Examiner* — Theron S Milliser
(74) *Attorney, Agent, or Firm* — Dorsey & Whitney LLP

(57) ABSTRACT

A device stand for a portable device, comprising a foldable extension leg which supports the portable device at a cable connection instead of directly supporting the portable device itself. In one or more embodiments, the device stand can be connected to a storage device such as a flash drive, or can directly incorporate a storage device into its form.

16 Claims, 18 Drawing Sheets

(51) Int. Cl.
*F16M 13/00* (2006.01)
*G06F 1/16* (2006.01)
*F16M 13/02* (2006.01)

(56) References Cited

U.S. PATENT DOCUMENTS

| | | | | |
|---|---|---|---|---|
| 7,735,644 B2* | 6/2010 | Sirichai | ...................... | A45F 5/02 |
| | | | | 206/320 |
| 8,382,059 B2* | 2/2013 | Le Gette | ................ | F16M 11/04 |
| | | | | 248/163.1 |
| 8,737,064 B2 | 5/2014 | Son et al. | | |
| 9,004,783 B1* | 4/2015 | Woodman | .............. | F16M 11/00 |
| | | | | 396/419 |
| 9,960,521 B2* | 5/2018 | Armstrong | ............ | G06F 1/1626 |
| 2002/0137475 A1* | 9/2002 | Shou | .................... | H04B 1/3838 |
| | | | | 455/575.8 |
| 2004/0223752 A1* | 11/2004 | Ghanouni | ............ | G03B 17/00 |
| | | | | 396/419 |
| 2005/0122424 A1* | 6/2005 | Overstreet | ........... | F16M 11/041 |
| | | | | 348/373 |
| 2008/0006745 A1* | 1/2008 | Chong | ................... | F16M 11/10 |
| | | | | 248/166 |
| 2008/0156836 A1* | 7/2008 | Wadsworth | ............ | A45C 11/00 |
| | | | | 224/269 |
| 2009/0230161 A1* | 9/2009 | Emsky | .................. | A45C 11/00 |
| | | | | 224/257 |
| 2010/0072334 A1* | 3/2010 | Le Gette | ................ | F16M 13/00 |
| | | | | 248/176.3 |
| 2010/0192171 A1* | 7/2010 | Dozoretz | ................ | H04N 5/64 |
| | | | | 725/5 |
| 2011/0253850 A1 | 10/2011 | Bau | | |
| 2012/0199501 A1* | 8/2012 | Le Gette | ................ | F16M 11/04 |
| | | | | 206/45.24 |
| 2013/0009024 A1* | 1/2013 | Liu | ........................ | F16M 11/10 |
| | | | | 248/125.8 |
| 2013/0327911 A1* | 12/2013 | Russell | .................. | A47B 17/03 |
| | | | | 248/276.1 |
| 2014/0274228 A1 | 9/2014 | Wong et al. | | |
| 2015/0034781 A1 | 2/2015 | Kim et al. | | |
| 2015/0201113 A1* | 7/2015 | Wood | ................... | G03B 17/561 |
| | | | | 348/376 |
| 2016/0070156 A1* | 3/2016 | Alster | .................. | G03B 17/563 |
| | | | | 396/424 |
| 2017/0234478 A1* | 8/2017 | Ren | ........................ | F16M 11/38 |
| | | | | 361/679.56 |

FOREIGN PATENT DOCUMENTS

| | | |
|---|---|---|
| CN | 204554264 U | 8/2015 |
| CN | 204578610 U | 8/2015 |
| CN | 204697425 U | 10/2015 |
| CN | 204887070 U | 12/2015 |
| CN | 105338140 A | 2/2016 |
| CN | 205069984 U | 3/2016 |
| JP | 3194429 U | 11/2014 |
| KR | 1020060010166 A | 2/2006 |
| KR | 2020120007453 U | 10/2012 |
| TW | M515614 U | 1/2016 |
| TW | 201737684 A | 10/2017 |
| TW | 201939934 A | 10/2019 |

OTHER PUBLICATIONS

First Office Action for TW Application No. 106108417, dated Mar. 7, 2018.

English Translation of Second Office Action for TW application No. 106108417 dated Nov. 20, 2018; pp. all.

Office Action for TW Application No. 106108417, dated Dec. 25, 2019.

Office Action for TW Application No. 108101987, dated Dec. 25, 2019.

English translation of CN Office Action for Application No. 201780021617.3, dated Mar. 4, 2020, pp. all.

* cited by examiner

Top View

Front View

Side View

Back View

Bottom View

FOLDING DEVICE STAND FOR PORTABLE DEVICES

CROSS REFERENCE TO RELATED APPLICATION(S)

This application claims the benefit under 35 U.S.C. §119(e) of the earlier filing date of U.S. Provisional Application 62/308,136 entitled "Folding Device Stand for Portable Devices," filed Mar. 14, 2016, and which provisional application is hereby incorporated by reference in its entirety for any purpose.

BACKGROUND

Many portable devices may be used for viewing content. To facilitate viewing, it is often desirable to position the portable device at a viewing angle that provides easy viewing of the portable device. However, it is not easy to balance the portable device for viewing without supporting the center of the device. For example, the device stand may fall over easily when the user touches the screen to play or pause media while using the portable devices. Savvy users viewing their portable devices often have to use additional bulky kickstands or hold the device by hand, however, the bulky stands may not be suitable for small and confined spaces, and holding the portable device may be tiring.

BRIEF DESCRIPTION OF THE DRAWINGS

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

DETAILED DESCRIPTION

Figure 1:
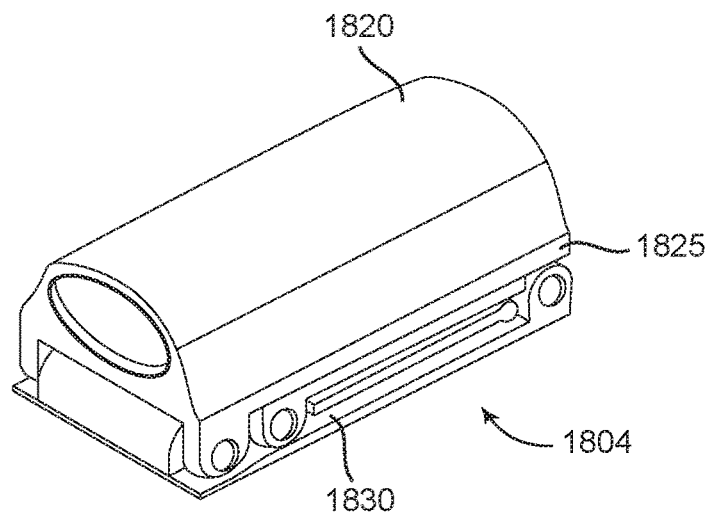
FIG. 1 is a perspective view of a folding device stand, according to one illustrated embodiment.

Various examples of embodiments of the invention will now be described. The following description provides specific details for a thorough understanding and enabling description of these examples. One skilled in the relevant art will understand, however, that embodiments of the invention may be practiced without many of these details. Likewise, one skilled in the relevant art will also understand that embodiments incorporate many other obvious features not described in detail herein. Additionally, some well-known structures or functions may not be shown or described in detail below, so as to avoid unnecessarily obscuring the relevant description.

The terminology used herein is to be interpreted in its broadest reasonable manner, even though it is being used in conjunction with a detailed description of certain specific examples of embodiments of the invention. Indeed, certain terms may even be emphasized below; any terminology intended to be interpreted in any restricted manner will, however, be overtly and specifically defined as such in this Detailed Description section.

Disclosed embodiments are directed to a folding device stand that attaches to a plug housing of a connection cable or a portable storage device, such as a flash drive.

In some embodiments, a device stand includes a foldable extension leg which allows for a small storage size when the device stand is not in use, and which allows for an adjustment to a viewing angle of a portable device.

The folding device stand may be designed to attach to the plug housing of a connection cable for a portable device, such as a charging cord or a USB cord. The folding device stand may also be designed to attach to the outer enclosure of a storage device, such as a thumb drive or memory stick. In an alternate embodiment, the folding device stand may be designed to incorporate a storage device directly as an integral component of the device stand.

The folding device stand allows users to view the screen of a portable device, such as a smart phone, tablet computer, or handheld device, without holding the device. This folding device stand may be designed such that it can be used when the portable device is used in a right-handed orientation or a left-handed orientation.

Embodiment One

Presented herein is a folding device stand or "kickstand" structural concept for use with storage devices and portable device cables. The device may include foldable extension legs, and provides an "A" stand by supporting the cable's connector, instead of balancing or supporting the device itself.

As known, it is not easy to balance a portable device by the connector area, instead of supporting the portable device's center area, which is how most device stands currently operate.

There are many portable storage devices and instant charging cables for smart phones, portable devices such as iPad mini, and other medium size touch pads. Savvy users are watching movies and TV from their portable devices and often have to use additional bulky kickstands or hold the device by hand. Embodiments of the present disclosure may provide a solution to support the device from the cable's connector area. The user can use the folding device stand in a small area without carrying an additional bulky device stand which needs to support the center of the device.

Embodiments of the disclosure include a kickstand that provides balance from the connector side (that is, from a connector built in to an edge of a portable device).

Embodiments of the disclosure are distinguishable from existing device stands in the market today. As previously mentioned, it is not easy to balance the devices without supporting the center of the device. For example, the device stand may fall over easily when the user touches the screen to play or pause media while using the portable devices.

Embodiments of the disclosure include kickstands for any size of device, using a foldable concept which can adjust the angle at which the portable device is being positioned in relation to a horizontal surface such as a desk, preventing the need for several different "kickstands" per device.

The folding legs allow the size of the device to be minimized to keep the smallest form factor, instead of carrying a bulky kickstand. The folding legs also allow one folding device stand to be adjusted to work with older phones with smaller screens to bigger screen devices such as iPad mini. As a result, a small kickstand may be used for many sizes of portable devices, or to easily use it in an airplane or on a desk which can have limited space.

In an alternative embodiment, the folding device stand concept can be extended for USB storage devices. For example, as will be described in greater detail below, in some embodiments, the folding device stand may be used with particular USB storage devices, such as the c20i flash drive device from Lexar, which provides an example folding device stand with a built-in storage device. The folding display stand structure may be small and allows the creation of a built-in USB thumb drive so that the user can store files, such as movies, in the storage device and connect it to a portable device without the need to transfer the files. The built-in device stand is convenient, allowing users to watch the screen without holding their device.

The folding display stand works left or right, both ways, and it is not necessary to remove the folding display stand from the device or rotate to switch back and forth. Left-handed users may prefer to locate their device (and its controls) to be on the right side and watch the movie, while right-handed users may prefer to locate their device to be on the left side and watch instead.

The features of the folding device stand may include:
1) Unique concept for balancing a device stand from the connector area.
2) A small form factor compared to similar existing products in the market.
3) Adjustable viewing angle by folding legs, allowing a user to use one kickstand for many sizes of devices.
4) Support balance of the device from both sides (left or right) without switching or detaching from the device.
5) As will be described in more detail below, a storage device product including a built-in device stand.

Turning to FIGS. 1-11, embodiments of a folding device stand shall be described in additional detail.

FIG. 1 is a perspective view of a folding device stand in accordance with an embodiment of the present disclosure as seen in its unfolded configuration. In one embodiment, the folding device stand has a main body, a first leg segment, a second leg segment, and a third leg segment, attached to each other by hinged joints. The first leg segment attaches to the main body by a hinged joint, the second leg segment attaches to the first leg segment by a second hinged joint, and the third leg segment attaches to the second leg segment by a third hinged joint. It would be obvious to one skilled in the art that the number of leg segments could vary without deviating from the inventive concept captured herein.

In one embodiment, the hinged joints may be constructed from roll pins that snap into c-shaped channels between the main body of the folding device stand and the first leg segment, or between successive leg segments. The hinged joints may include features such as slots, detents, or friction pads to hold an unfolded leg in a deployed position. The hinge joints may be made from any appropriate material and method, and the examples discussed herein are intended as examples only.

In one embodiment, the main body of the folding device stand may be designed to attach to or encapsulate the plug housing and/or strain relief collar of a connection cable for a portable device, such as a charging cable or a USB cable.

Figure 2:
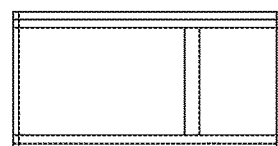
FIG. 2 provides six views of the folding device stand of FIG. 1, according to one illustrated embodiment.
Figure 2:
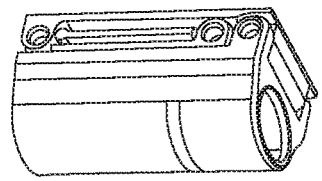
Figure 2:
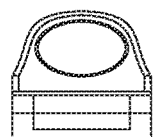
Figure 2:
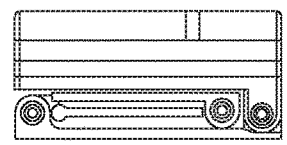
Figure 2:
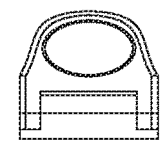
Figure 2:
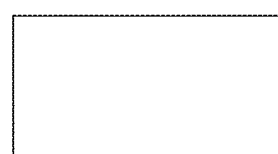

FIG. 2 provides six different views of the folding device stand of FIG. 1 in its fully folded (storage) configuration, including a top view, side view, bottom view, front view, back view, and perspective view.

Figure 3:
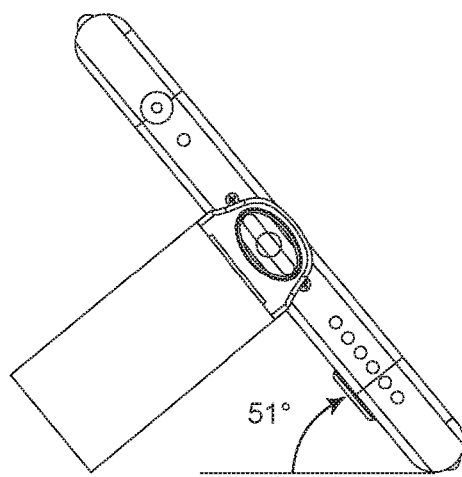
FIG. 3 shows a folding device stand in accordance with an embodiment of the present disclosure in use after one segment of the stand has been unfolded, according to one illustrated embodiment.

FIG. 3 shows a side view of a folding device stand in accordance with an embodiment of the present disclosure in use on a portable device after the first leg segment of the stand has been unfolded. In the example shown in FIG. 3, the portable device is held at a 51 degree angle to the surface on which the portable device is resting when one leg segment is unfolded. However, it would be obvious to one skilled in the art that the exact angle would change based on the size and type of the portable device, the length of the leg segments, and the angle at which the leg segment is held in comparison to the angle of the main body when it is attached to the portable device.

Figure 4:
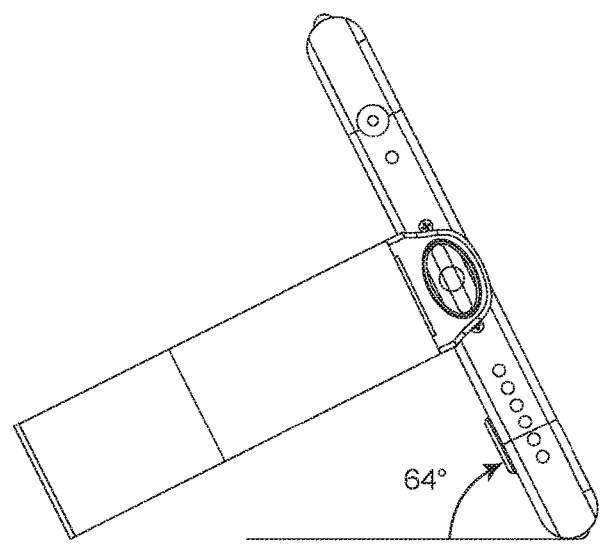
FIG. 4 shows the folding device stand of FIG. 3 in use after two segments of the stand has been unfolded, according to one illustrated embodiment.

FIG. 4 shows a side view of the folding device stand of FIG. 3 in use on a portable device after the first and second leg segments of the stand has been unfolded. In the example shown in FIG. 4, the portable device is held at a 64 degree angle to the surface on which the portable device is resting when two leg segments are unfolded. These figures and angles are examples only and not meant to be limiting in any way.

Figure 5:
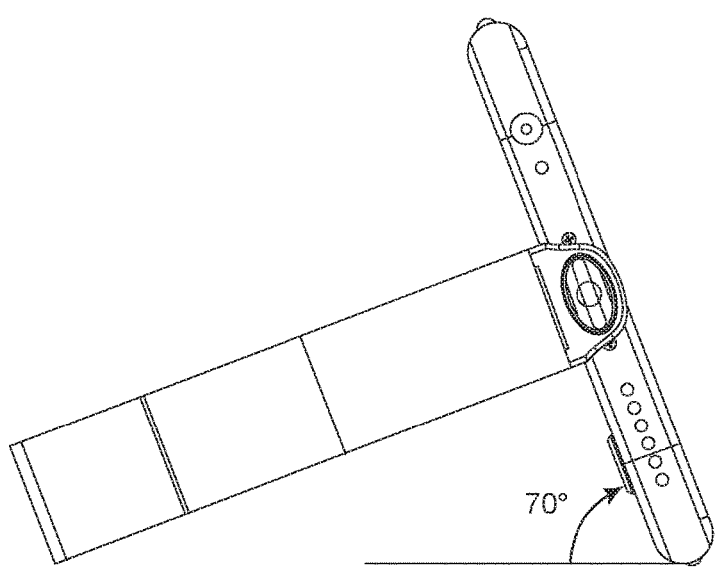
FIG. 5 shows the folding device stand of FIG. 3 in use after three segments of the stand has been unfolded, according to one illustrated embodiment.

FIG. 5 shows a side view of the folding device stand of FIG. 3 in use on a portable device after the first, second, and third leg segments of the stand has been unfolded. In the example shown in FIG. 5, the portable device is held at a 70 degree angle to the surface on which the portable device is resting when three leg segments are unfolded. These figures and angles are examples only and not meant to be limiting in any way.

Figure 6:
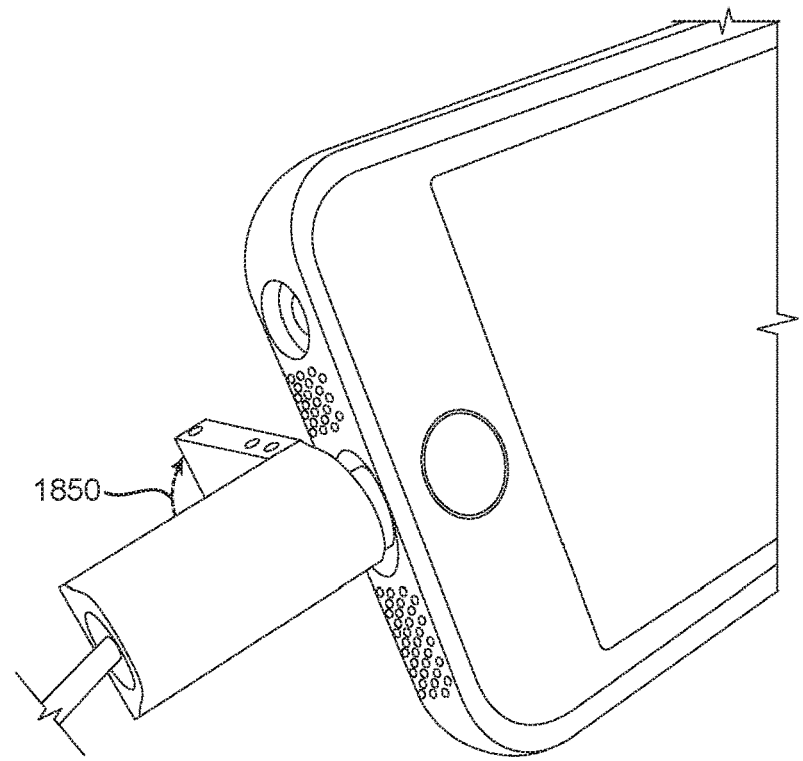
FIG. 6 shows a perspective view of a folding device stand in accordance with an embodiment of the present disclosure after one segment of the stand has been unfolded, according to one illustrated embodiment.

FIG. 6 shows a perspective view of a folding device stand in accordance with an embodiment of the present disclosure in use on a portable device after one leg segment of the stand has been unfolded.

Figure 7:
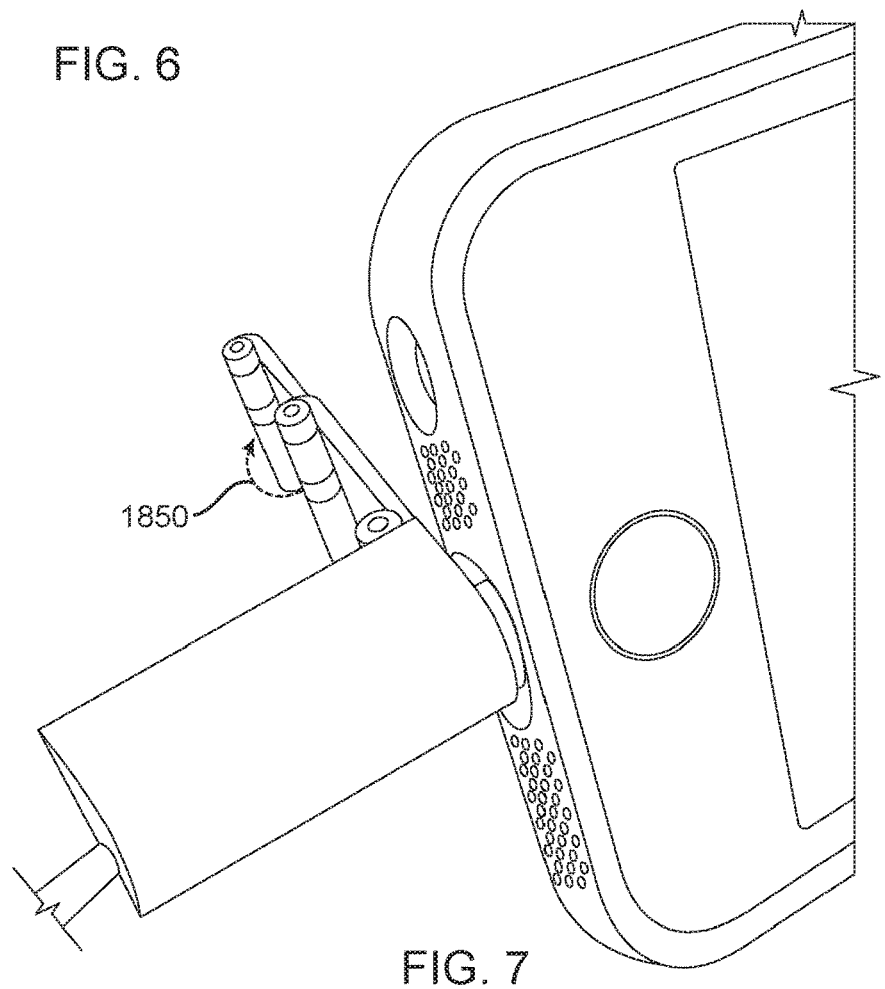
FIG. 7 shows a perspective view of the folding device stand of FIG. 6 after two segments of the stand have been unfolded, according to one illustrated embodiment.

FIG. 7 shows a perspective view of the folding device stand of FIG. 6 in use on a portable device after two leg segments of the stand have been unfolded.

Figure 8:
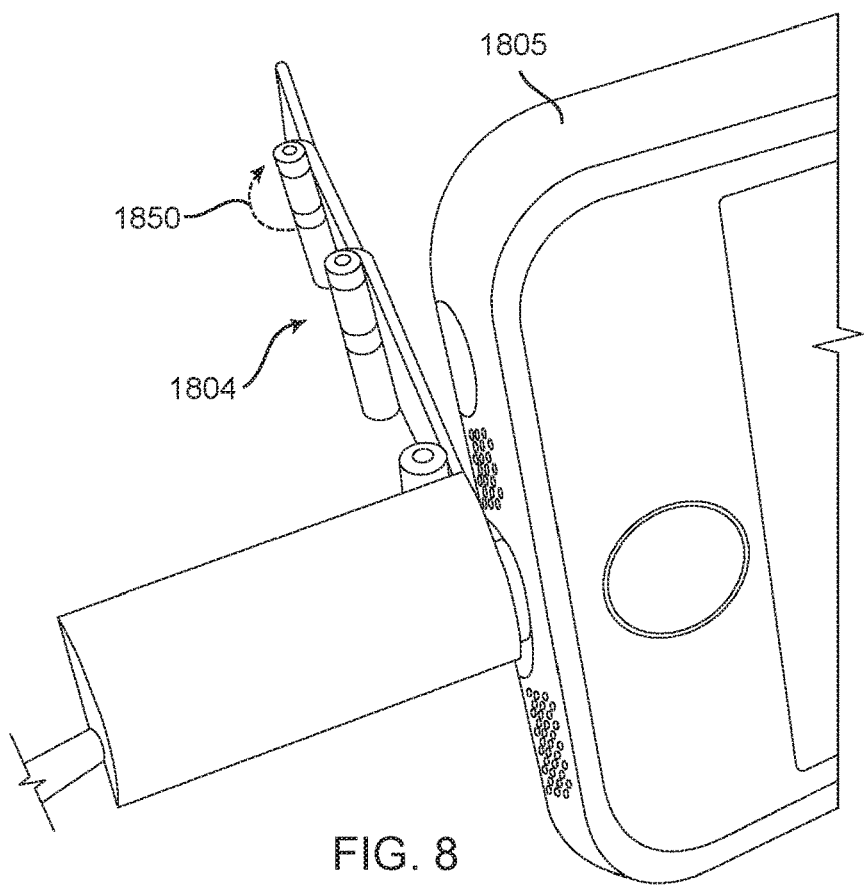
FIG. 8 shows a perspective view of the folding device stand of FIG. 6 after three segments of the stand have been unfolded, according to one illustrated embodiment.

FIG. 8 shows a perspective view of the folding device stand of FIG. 6 in use on a portable device after three leg segments of the stand have been unfolded.

Figure 9:
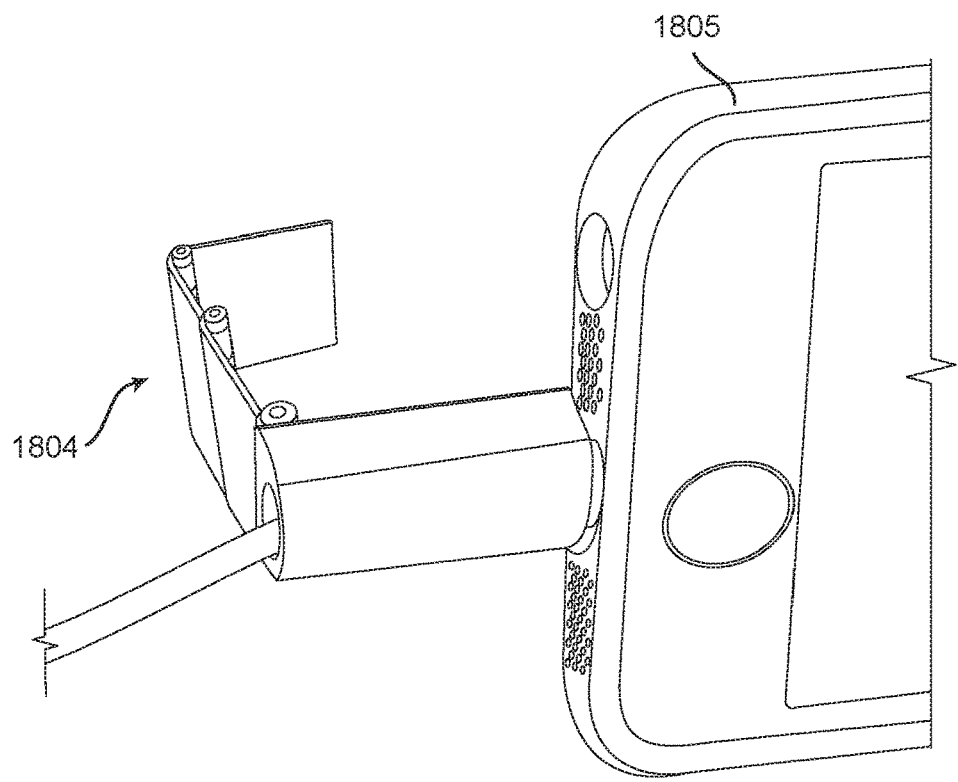
FIG. 9 shows the folding device stand of FIG. 6 after three segments of the stand have been unfolded, with the third leg segment at a 90 degree angle to the first two unfolded segments, according to one illustrated embodiment.

FIG. 9 shows a perspective view of the folding device stand of FIG. 6 after three segments of the stand have been unfolded, with the third leg segment at a 90 degree angle to the first two unfolded segments. This configuration allows for additional stability.

Figure 10:
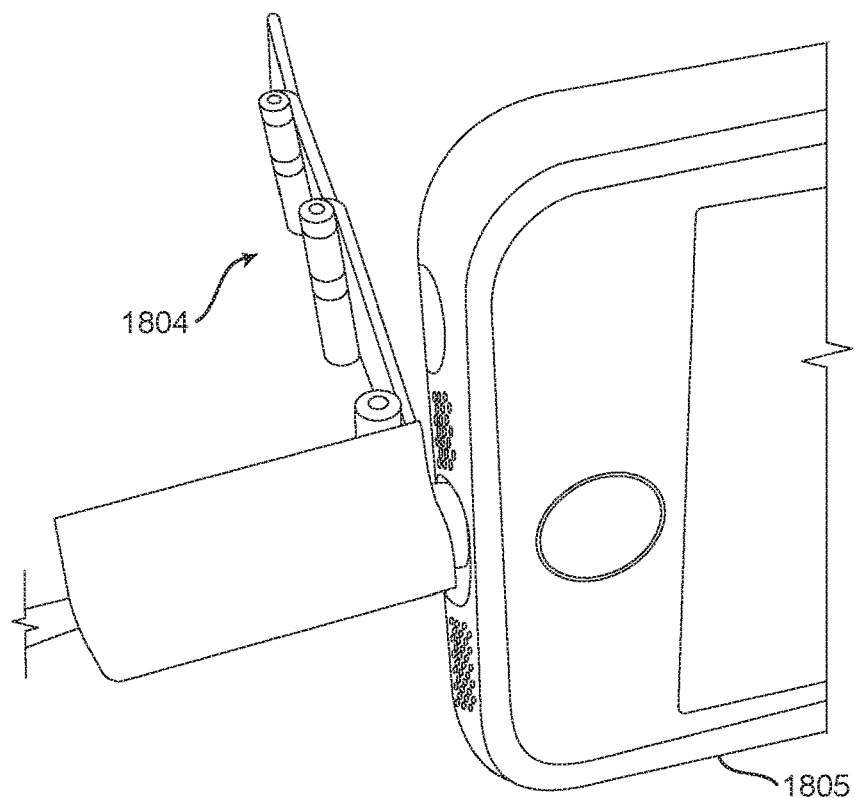
FIG. 10 illustrates how the folding device stand of FIG. 6 can be used from a left-handed user's position, according to one illustrated embodiment.
Figure 11:
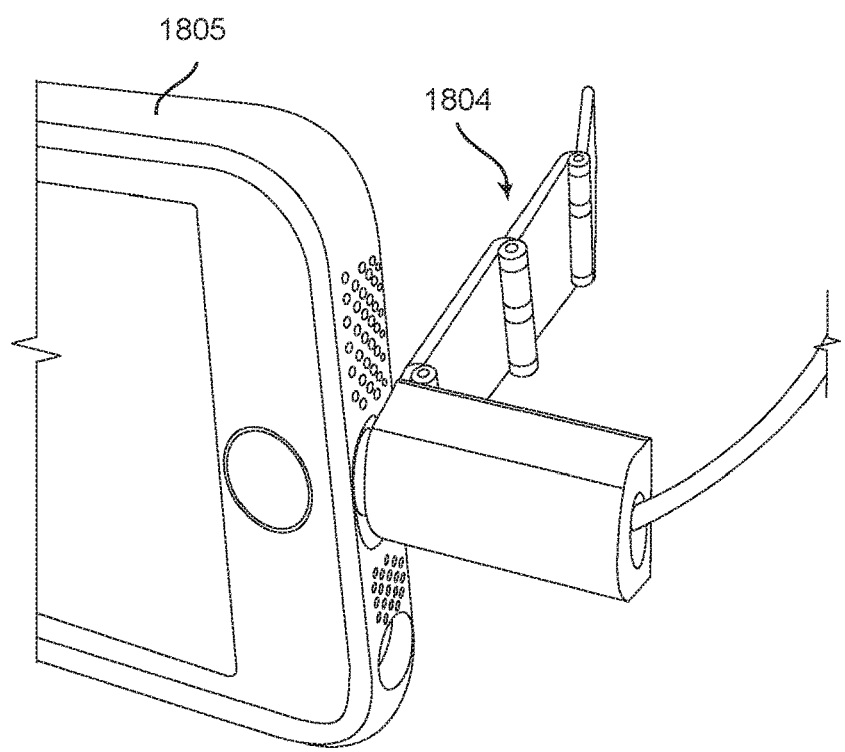
FIG. 11 illustrates how the folding device stand of FIG. 6 can be used from a right-handed user's position, according to one illustrated embodiment.

FIG. 10 illustrates how the folding device stand of FIG. 6 can be used from a left-handed user's position. FIG. 11 illustrates how the folding device stand of FIG. 6 can be used from a right-handed user's position.

Additional information on an alternate embodiment of the folding device stand for use with a storage device (such as a flash drive) is provided in the following section.

Alternate Embodiment with Storage Device

Presented herein is a folding device stand or "kickstand" structural design concept incorporating a storage device which extends the memory of a smartphone device and charging functional cable. The examples and drawing provided herein are based on the c20i flash drive product by Lexar. However, any type of storage device, cable, or other product that plugs into a connector on the edge of a portable device could be used without departing from the scope of the present disclosure.

This alternate embodiment is a small form factor foldable extension leg which provides an "A" device stand by supporting a flash memory drive plugged into a portable device, instead of balancing or supporting the portable device itself. The balancing point is on the memory device's connector which is unique to other "kickstand" concepts.

The folding device stand provides a solution to support the portable device from the cable's connector area of a flash drive plugged into the portable device. The user can use the folding device stand in an airplane or small area without carrying an additional bulky kickstand which needs to support the center of the device.

Additional detail on the embodiments described above is provided in the discussion of the drawings in the following paragraphs. FIGS. 12-17 describe an embodiment based on a storage device for a portable device.

In an alternate embodiment, the main body of the folding device stand may be designed to attach to or encapsulate the enclosure of a separate portable storage device, such as a thumb drive. In yet another alternate embodiment, the main body of the folding device stand may directly incorporate a storage device as an integral component of the folding device stand.

Turning to FIGS. 12-17, an alternate embodiment of the folding device stand utilizing additional storage shall be described in additional detail.

Figure 12:
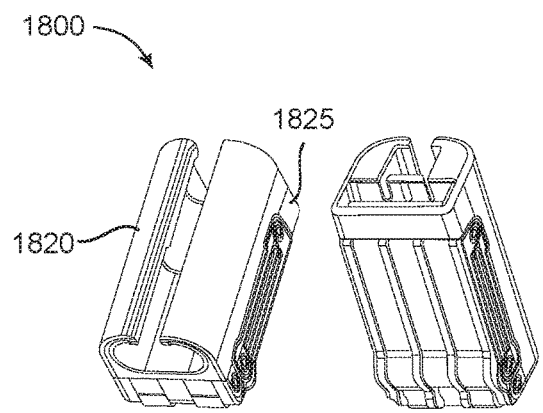
FIG. 12 is a perspective view of an alternate embodiment of a folding device stand, according to one illustrated embodiment.
Figure 13:
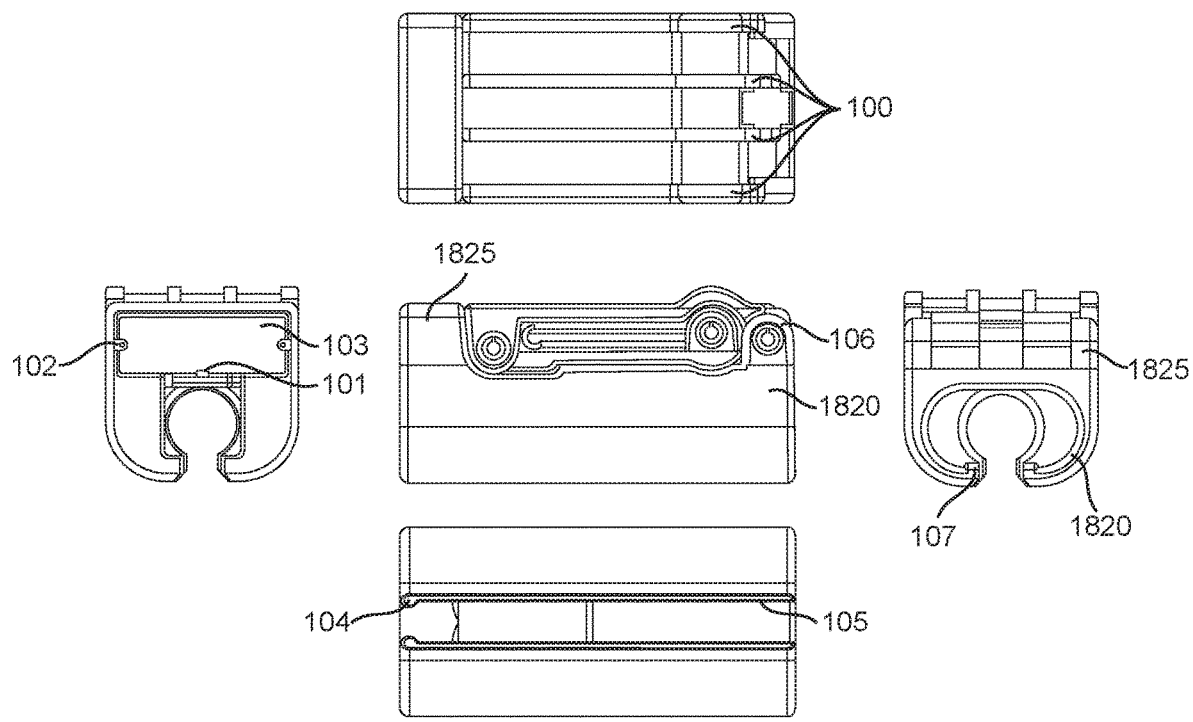
FIG. 13 provides five different views of the alternate embodiment of the folding device stand of FIG. 12, according to one illustrated embodiment.

FIG. 12 is a perspective view of an alternate embodiment of the folding device stand designed to work with a separate storage device. In this embodiment, a split in the device creates a channel through with a cord or cable can be fed to facilitate installation of the folding device stand on a storage device. The openings on either end of the folding device stand may be different sizes to accommodate both the device connector (for example, a lightning connector for an iPhone) and a standard serial connector (for example, a USB or similar connector FIG. 13 provides five different views of the alternate embodiment of the folding device stand of FIG. 12. Structural ribs 100 are incorporated into the main body to provide structural strength inside the USB connector (also shown as 103), side ribs 102 and bottom rib 101 are used to guide the insertion of a USB connector from a storage device when the folding device stand with integrated storage is folded for travel or storage. Protrusions 104 along an edge of a channel 105 may be provided to assist with containing a cable in the cable guide. A roll pin 106 may be used to provide a hinge for the legs of the folding device stand. The device connector opening on the folding device stand may offer additional features such as small nubs 107 which put additional force and friction on the device connector to provide an interference fit when the device connector is in place, preventing the folding device stand from slipping out from the device connector.

In some embodiments, the cord of a storage device (or any cable with a connector capable of plugging into a portable device) could be pushed into the channel such that the cable's device connector extends out through and past the device connector opening in the folding device stand. Then, a user can pull on the end of the cord that is extending out of the USB connector opening in the folding device stand until the device connector on the cable is pulled back such that the housing of the device connector seats itself just inside the device connector opening on the folding device stand. The inside of the device connector opening may have a built-in feature such as a physical stop to prevent the device connector from being pulled inside and possibly through the body of the folding device stand. An example of a physical stop is shown in FIG. 13.

Figure 14:
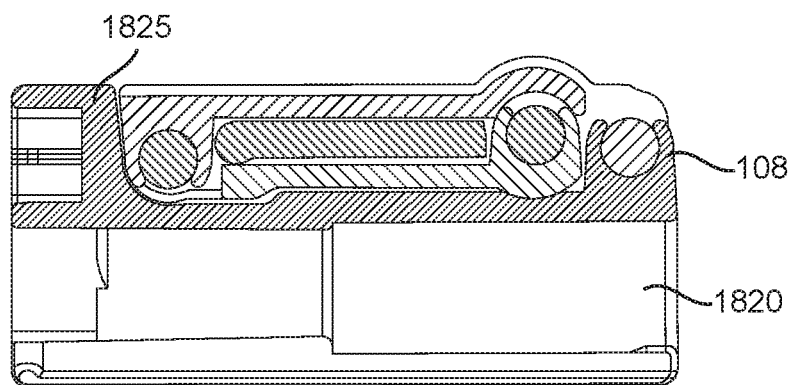
FIG. 14 shows a cross-sectional view of a folding device stand in accordance with an embodiment of the present disclosure, according to one illustrated embodiment.

FIG. 14 shows a cross-sectional view of a folding device stand in accordance with an embodiment of the present disclosure in its folded configuration, with no storage device present. A hinge may be formed from a c-shaped channel 108 that receives a pin or axle to allow rotation of a leg of the folding device stand. The c-shaped channel 108 may be configured to provide rotational resistance to the pin when the leg is rotated. For example, arms of the c-shaped channel may have portions that decrease the radius of the channel at the ends of the arms, along with spring force of resilient arms, to apply a friction force to the pin to provide rotational resistance. In some embodiments, the pin and channel may be configured to form detents to provide positions along the rotation of the arm at which the arm is held open.

Figure 15:
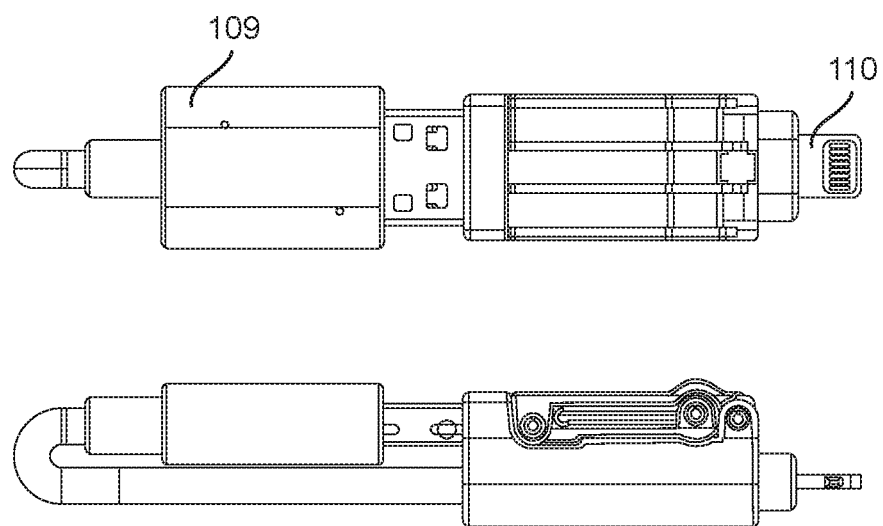
FIG. 15 shows a folding device stand in accordance with an embodiment of the present disclosure attached to a storage device in a folded configuration, according to one illustrated embodiment.

FIG. 15 shows a folding device stand in accordance with an embodiment of the present disclosure attached to a storage device (for example, the c20i flash drive by Lexar) a folded configuration. The USB end 109 of the storage device can be inserted into the USB connector of the folding device stand for storage. The USB end 109 may include a semiconductor device for storing data. The device connector end 110 is inserted into the folding device stand and sticks out through the device connector opening on the folding device stand. The device connector end 110 sticks out far enough to allow users to use the folding device without removing their smartphone case, because the offset distance allows for various phone case thicknesses.

Figure 16:
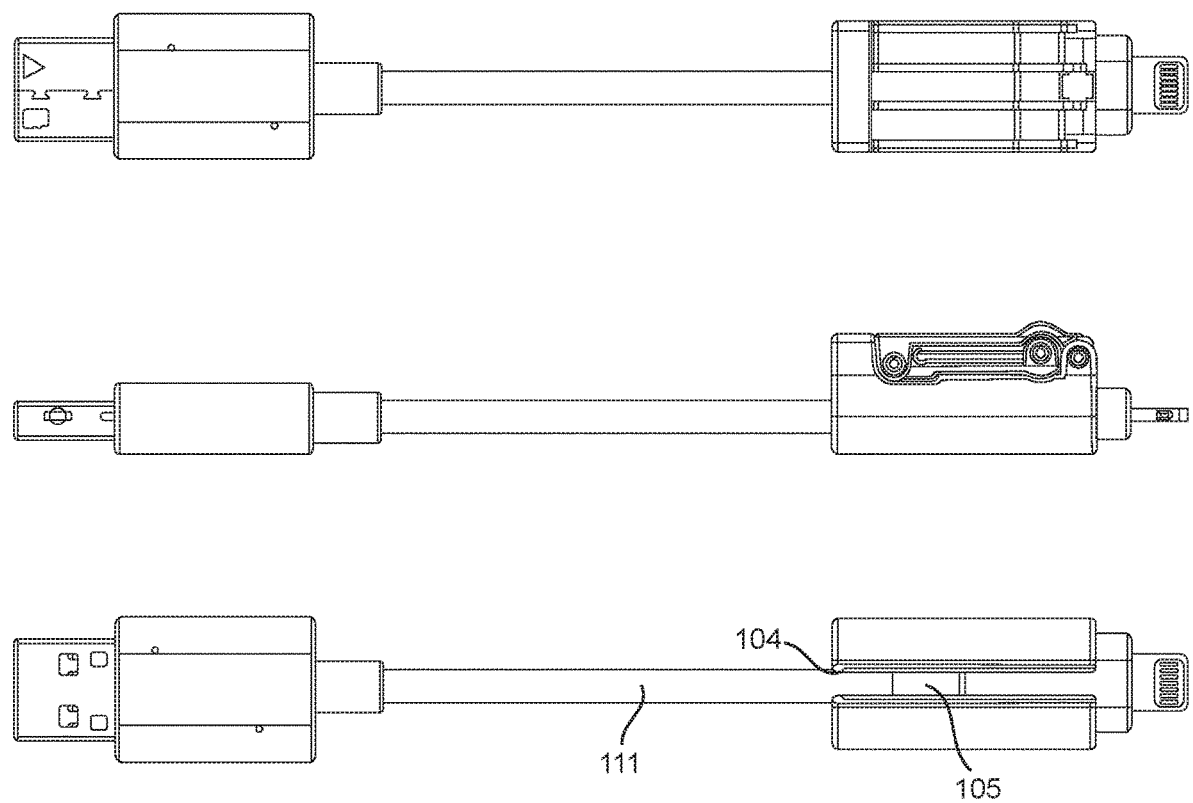
FIG. 16 shows the folding device stand of FIG. 15 attached to a storage device in an unfolded configuration, according to one illustrated embodiment.

FIG. 16 shows the folding device stand of FIG. 15 attached to a storage device in an unfolded configuration. A cable 111 connects the device connector to the USB connector.

Figure 17:
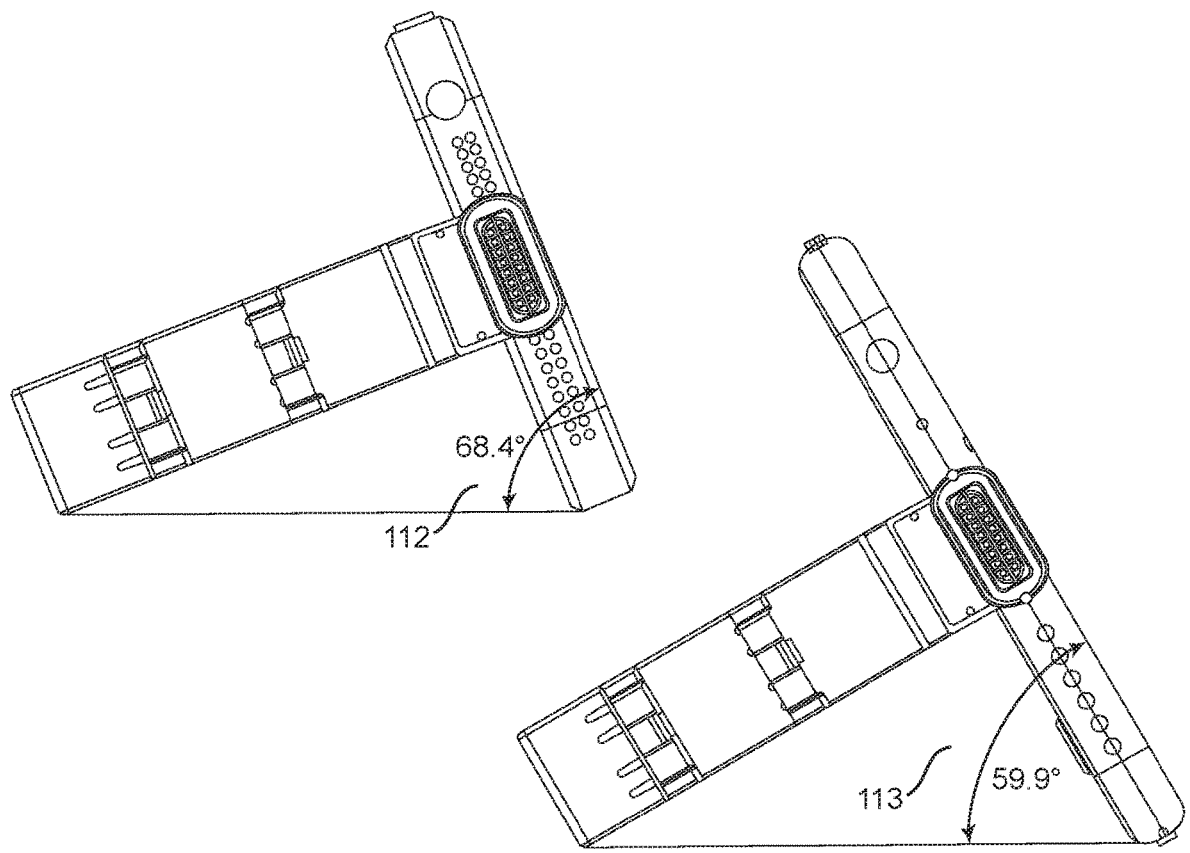
FIG. 17 shows a folding device stand in accordance with an embodiment of the present disclosure holding a portable device for viewing at different viewing angles, according to one illustrated embodiment.

FIG. 17 shows a folding device stand in accordance with an embodiment of the present disclosure holding two types and sizes of portable devices, showing how the size of the portable device can affect the viewing angle of the portable device. For example, a first viewing angle 11.2 is provided with a first portable device, and a second viewing angle 113 is provided with a second portable device.

FIG. 18A-18D show illustrated views of a stand 1800 to balance a portable device 1805 where the stand 1800 is attachable to at least a portion of a housing 1810 of a connection cable 1815, according to one illustrated embodiment.

Figure 18A:
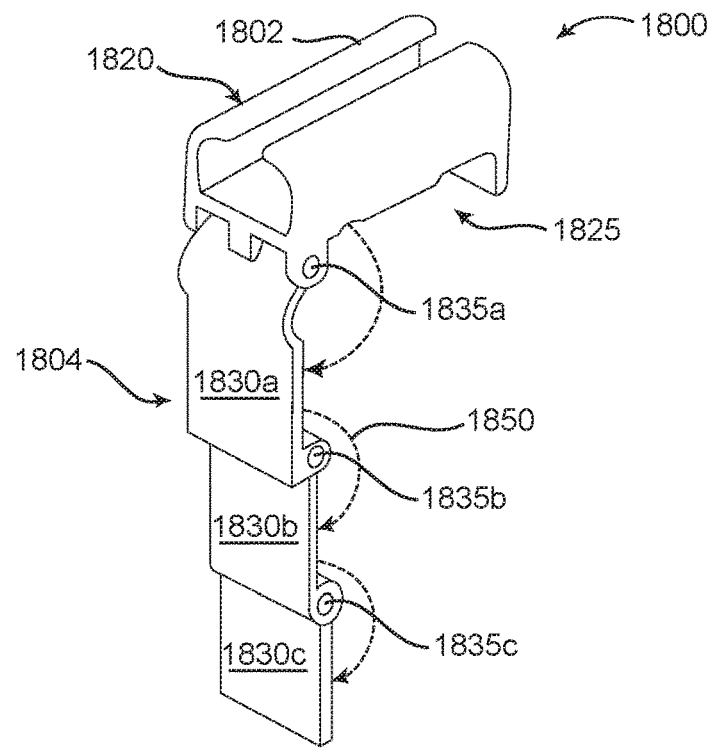
FIG. 18A-18D are illustrated views of a stand to balance a portable device, where the stand is coupleable to at least a portion of a housing of a connection cable, according one illustrated embodiment.
Figure 18B:
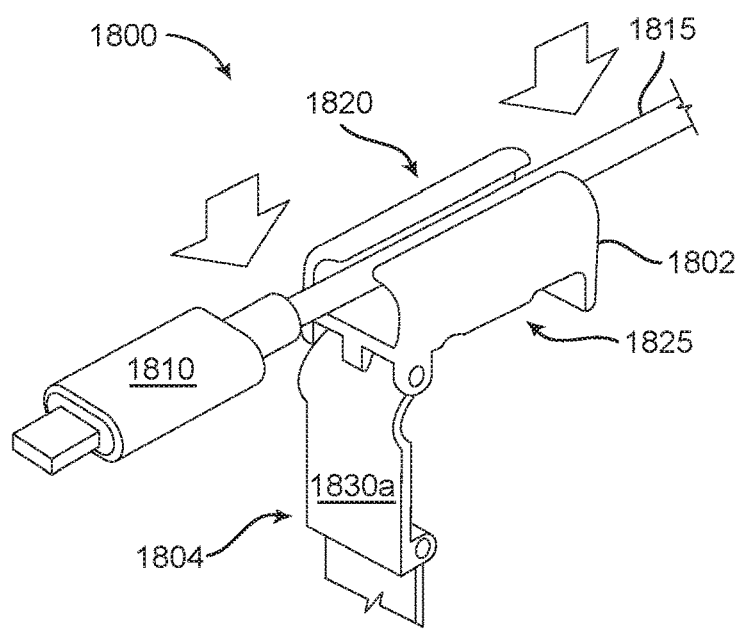
Figure 18C:
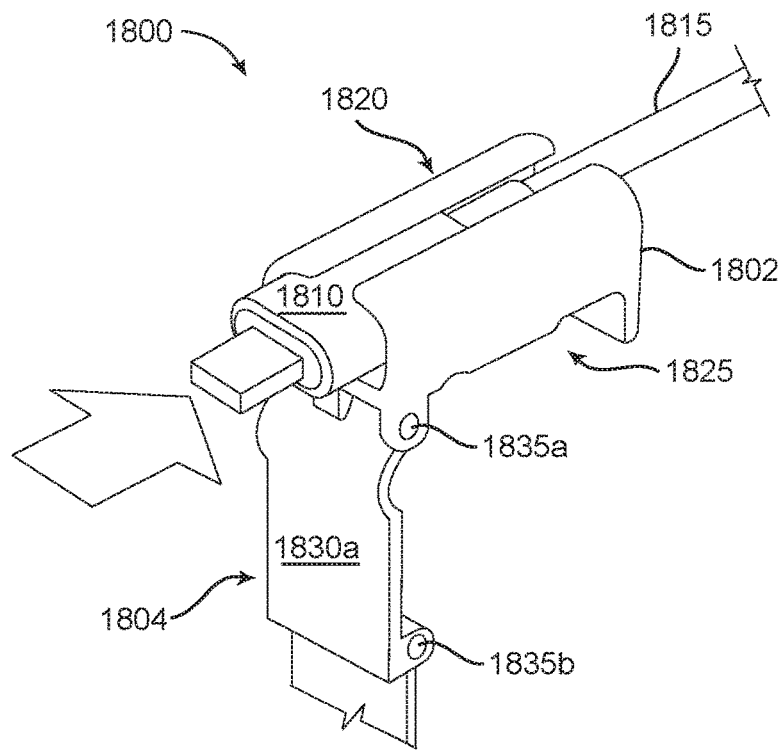

The stand 1800 includes a body 1802 and extension unit 1804 coupled to the body 1802. The body 1802 may comprise a first side 1820 opposed a second side 1825. The first side 1820 includes a receptacle formed to engage with the housing 1810 of the connection cable 1815. The receptacle may be any shape or size to accommodate the housing 1810 of any type of connection cable 1815 or storage device. For example, the receptacle may be sized to engage with the housing 1810 of a lightning connector or the housing 1810 of a flash drive. As illustrated in FIGS. 18B-18C, the first side of the stand 1800 engages with the housing of the connection cable 1815 in response to inserting the connection cable 1815 into the receptacle and then laterally sliding the connection cable 1815 until the housing 1810 is at least partially encapsulated by the receptacle.

The extension unit 1804 comprises a plurality of segments (illustrated as 1830a, 1830b, 1830c and collectively referenced herein as 1830) that are foldable about a plurality of hinged joints (illustrated as 1835a, 1835b, 1835c and collectively referenced herein as 1835), respectively. The plurality of segments 1830 may be coupled to the second side 1825 of the body 1802. As illustrated in FIGS. 18A-C, a first hinged joint 1835a of the plurality of hinged joints 1835 may be positioned along an end of the second side 1825 of the body 1802. The first segment 1830a of the plurality of segments 1830 may have a first end rotatively coupled about the first hinged joint 1835a.

Furthermore, the second and third segments 1830b, 1830c may be rotatively coupled about the second and third hinged joints 1835b, 1835c, respectively. The second hinged joint 1835b may be positioned along an end of the first segment 1830a, while the third hinged joint 1835c may be positioned along an end of the second segment 1830b. It will be understood by those of ordinary skill in the art, that any number of segments and hinges may be employed to implement the extension unit 1804. For example, a single segment and corresponding hinged joint may be employed as well as multiple segments interconnected by respective hinged joints.

Figure 18D:
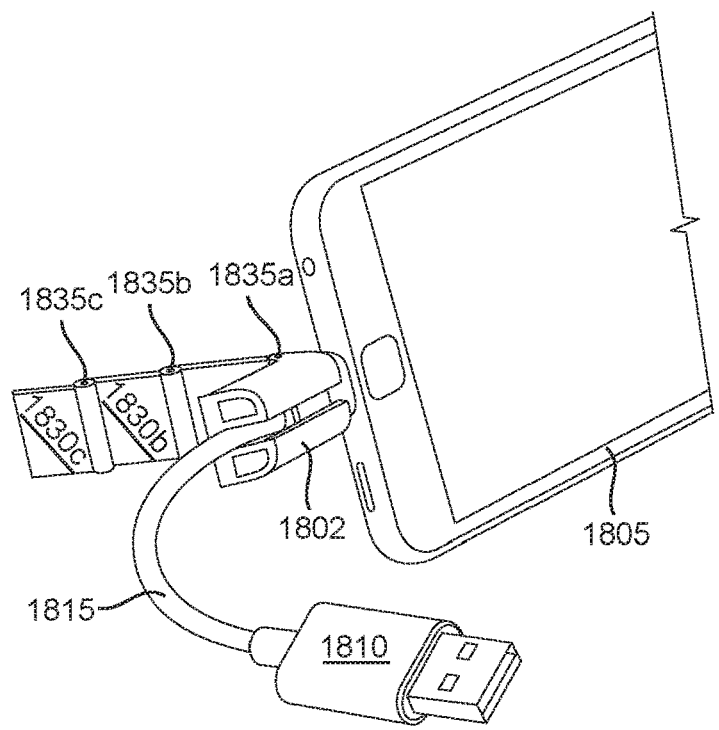
Figure 19A:
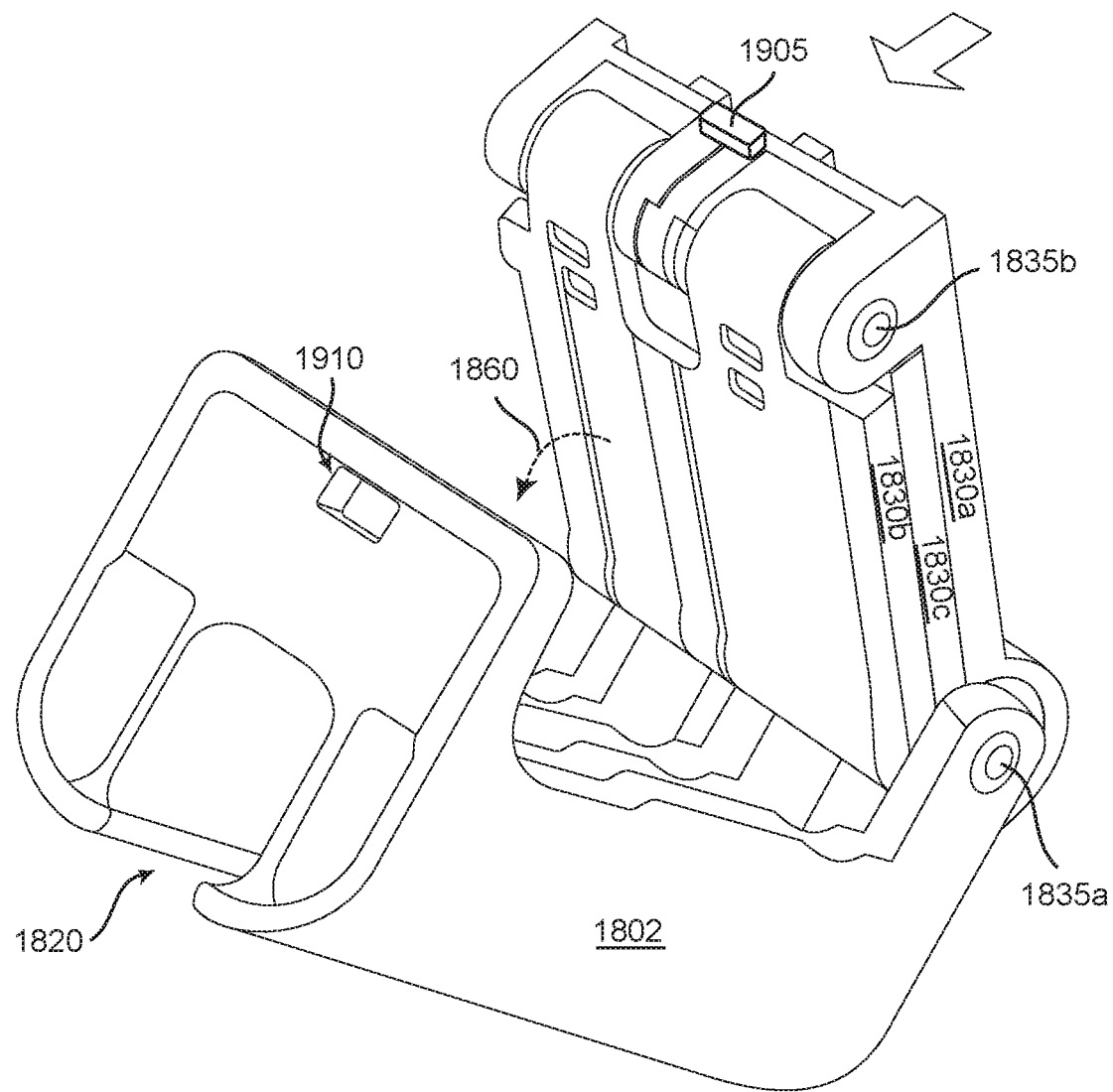
FIGS. 19A-19C are three dimensional graphical representations of the stand, including a locking mechanism, according to one illustrated embodiment.
Figure 19B:
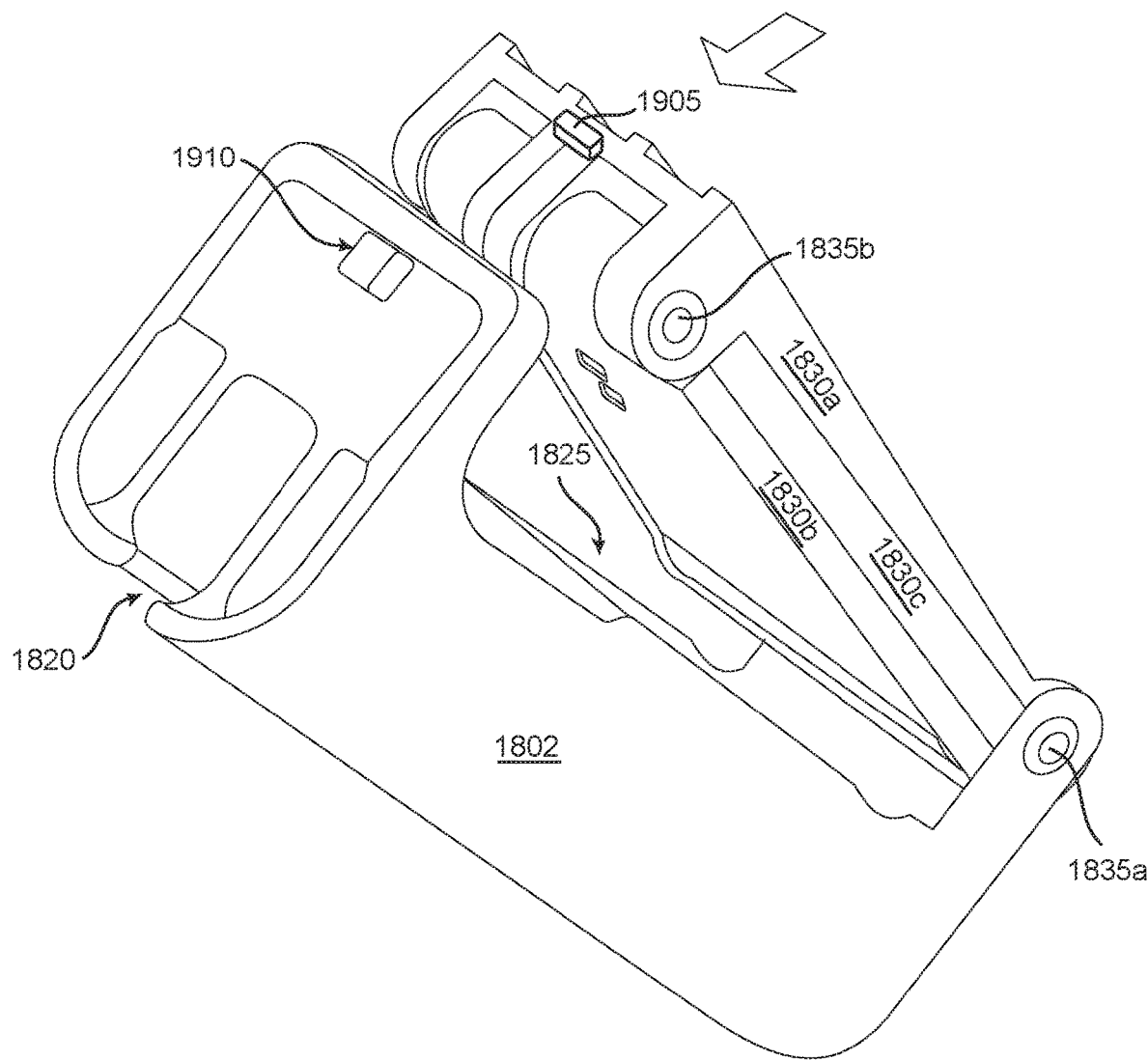
Figure 19C:
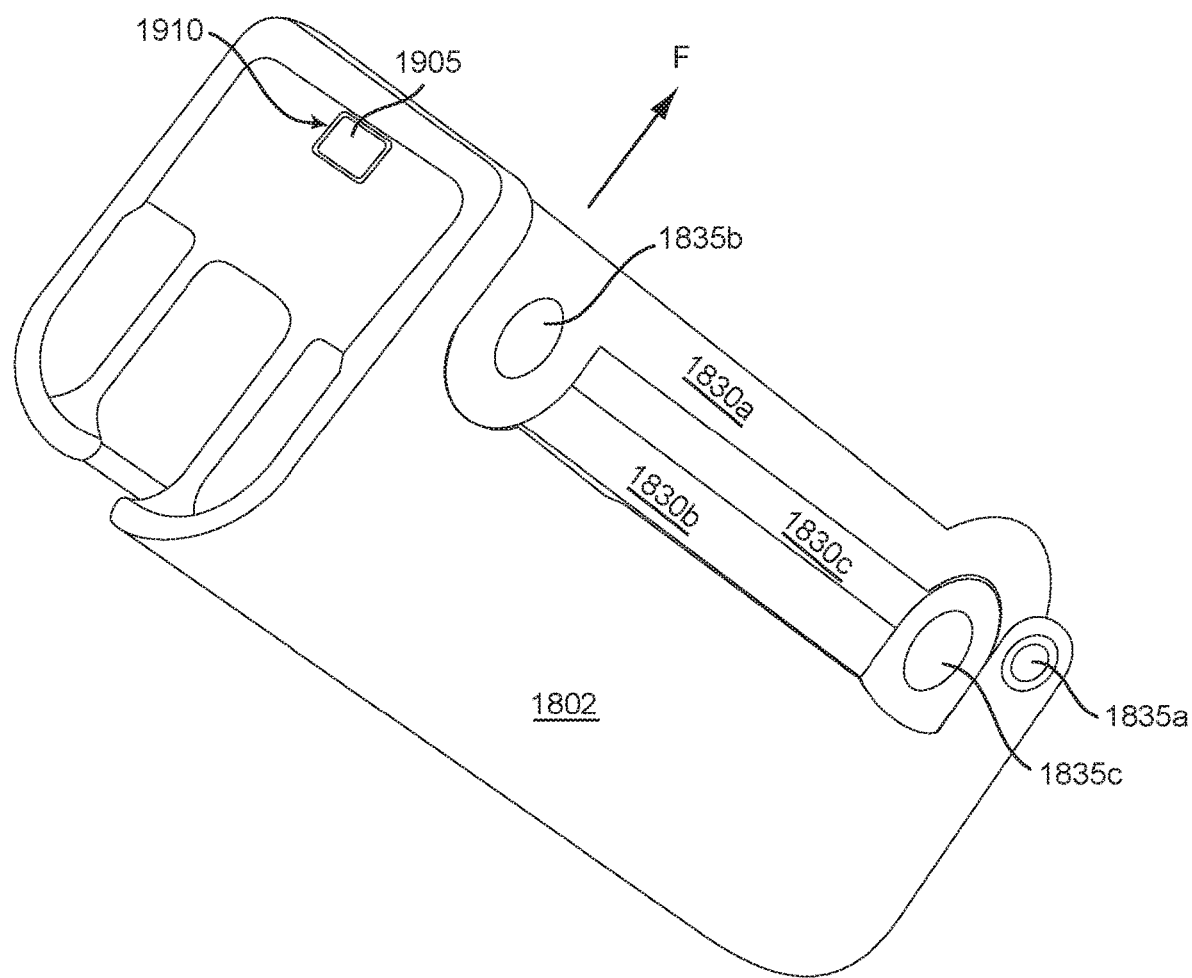
Figure 20A:
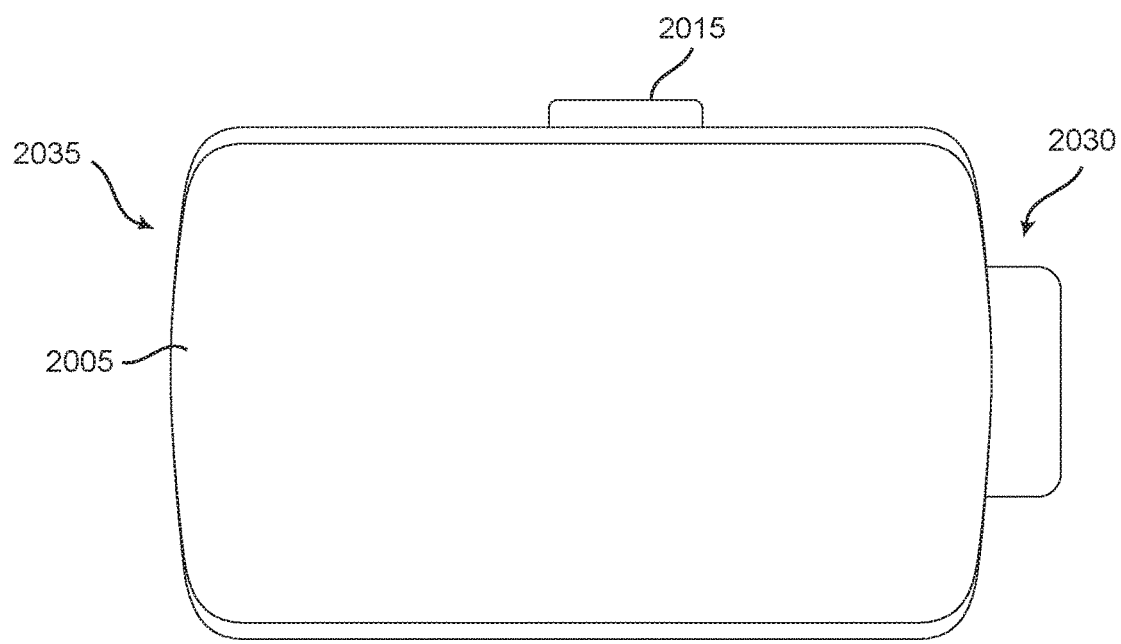
FIG. 20A is a top view of an integrated stand, according to one illustrated embodiment.
Figure 20B:
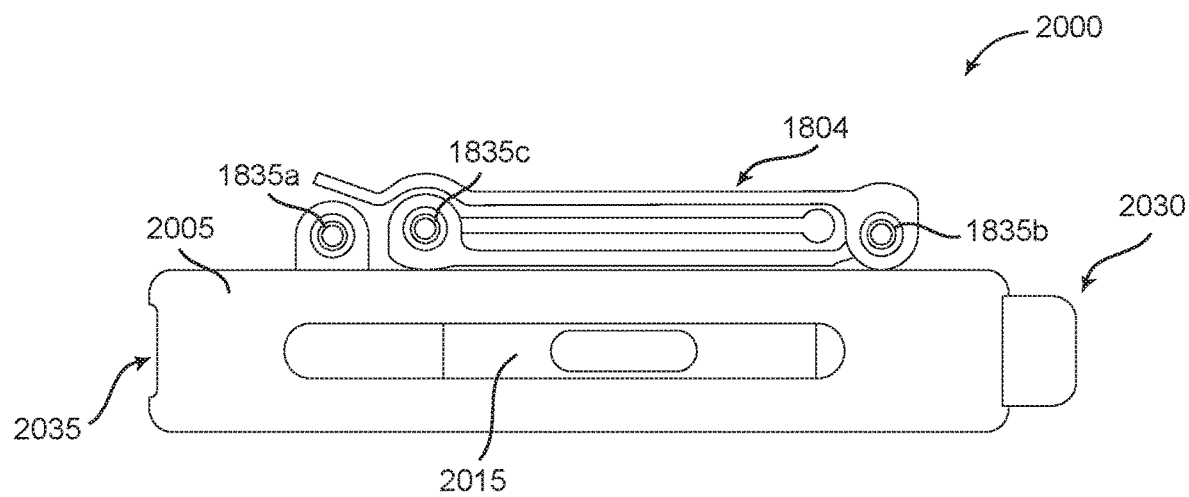
FIG. 20B is a side view of the integrated stand, according to one illustrated embodiment.
Figures 20C, 20D:
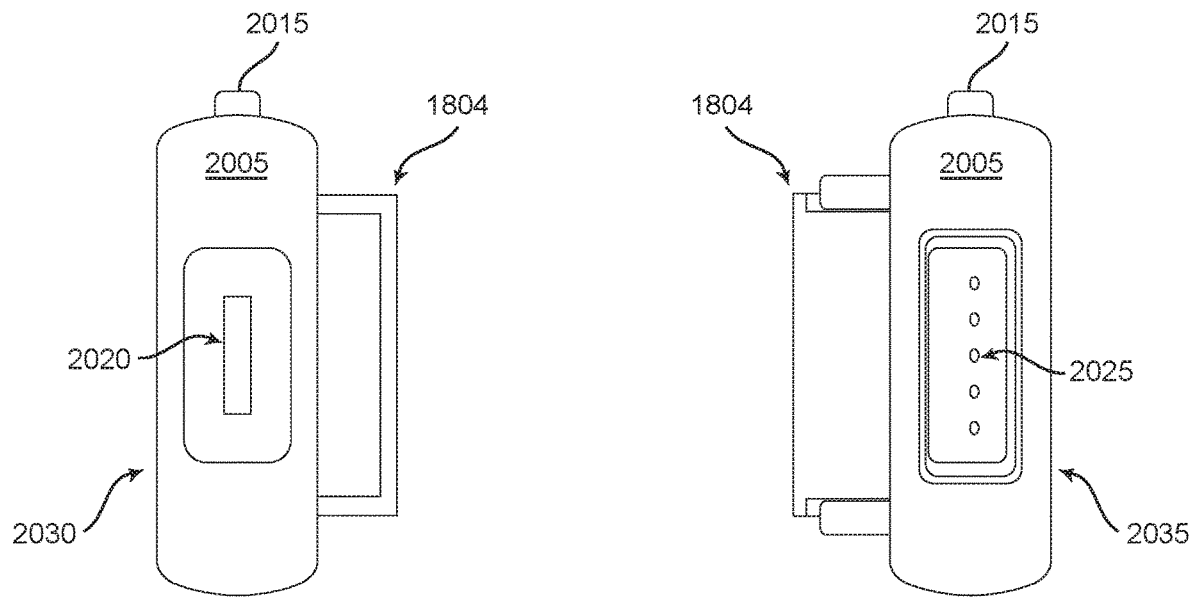
FIG. 20C is a front view of the integrated stand, according to one illustrated embodiment.
FIG. 20D is a rear view of the integrated stand, according to one illustrated embodiment.
Figure 20E:
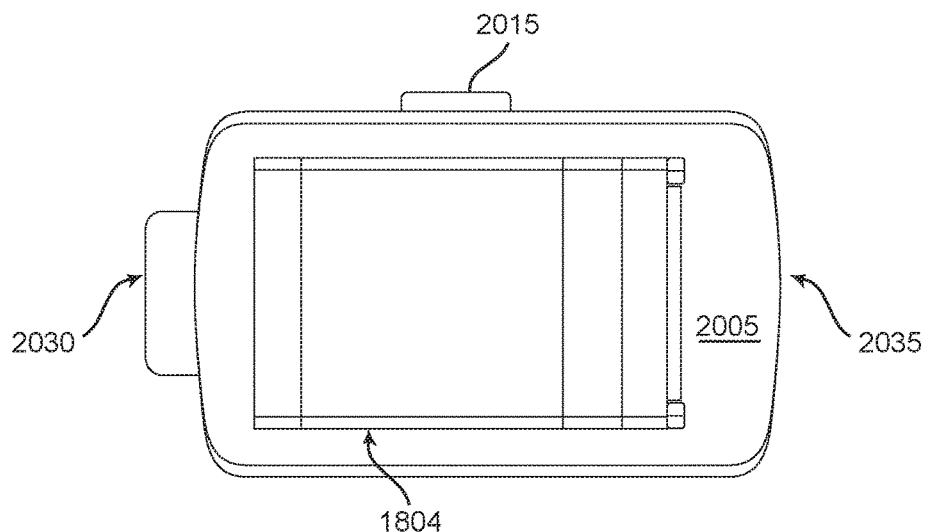
FIG. 20E is a bottom view of the integrated stand, according to one illustrated embodiment.

The plurality of segments 1830 may be in a folded position (as illustrated in FIGS. 19A-19C) or may be in an extended position (as illustrated in FIGS. 18A and 18D). The plurality of segments 1830 may be folded in response to being rotated about the plurality of hinged joints 1835, respectively, in a first direction 1860. In one example, the third segment 1835c located in the outermost position away from the second side 1825 of the body 1802 may be folded within the second segment 1835b before the second segment 1835b is folded within the first segment 1835a. It will be understood by those of ordinary skill in the art that regardless of the number of segments, the outermost segment may typically be folded within a preceding segment prior to the preceding segment being itself folded within its preceding segment.

As illustrated in FIGS. 1-2, 12-14, and 19A-19C, in response to being in the folded position, the plurality of segments 1830 may be foldably stored within the second side 1825 of the body 1802 of the stand 1800. Foldably storing the plurality of segments 1830 within the body 1802 of the stand 1800 may be advantageous in assuring a minimal form factor of the stand 1800.

As illustrated in FIGS. 6-8, the plurality of segments 1830 may be extended from the folded and stored position in response to being rotated about the plurality of hinged joints 1835, respectively, in a second direction 1850. The second direction 1850 is opposite the first direction 1860. In one example, the first segment 1830a having the second and third segments 1830b, 1830c folded therein, may be unfolded from the second side of the body 1802 before the second segment 1830b is unfolded. Additionally, the second segment 1830b may be unfolded from within the first segment 1830a before the third segment 1830c is unfolded.

The plurality of segments 1830 are extended to provide balance to the portable device 1805. Furthermore, the connection cable 1815 may be coupled to an edge of the portable device 1805. Because the stand 1800, having the extended plurality of segments 1830, engages with the housing 1810 of the connection cable 1815, the plurality of segments 1830 provide balance from the edge of the portable device.

The unfolded or extended plurality of segments 1830 may be advantageous in adjusting an angle at which the portable device is positioned relative a horizontal surface, such as, for example, a desk. A desired angle of the portable device may be achieved by, for example, unfolding or extending respective ones of the plurality of segments 1830 to a desired position. It will be appreciated by those of ordinary skill in the art, the greater the number of the plurality of segments 1830 to be adjusted, the greater the granularity in achieving the desired angle. The adjustability of the angle may be further advantageous to allow for operation with various sizes of portable devices. For example, a large sized portable device may employ a longer extension unit 1804 to achieve a desires balance angle, while a small-sized portable device may employ a short extension unit 1804 to achieve a desired balance angle.

FIGS. 19A-19C show three dimensional graphical representations of the stand 1800, including a locking mechanism embedded within the stand 1800, according to one illustrated embodiment.

The locking mechanism comprises a protrusion 1905 configured to engage with a recess 1910. The protrusion 1905 may extend from the end of the first segment 1830a, which includes the second hinged joint 1835b. The recess 1910 may extend through a further end of the second side 1825 of the body 1802 of the stand 1800. The further end positioned opposite the end of the second side 1825 of the body 1802 having the first hinged joint 1835a.

The protrusion 1905 may be configured to engage with the recess 1910 in response to the plurality of segments 1830 being in the folded position. In particular, when the second segment 1830b and the third segment 1830c are folded proximate the first segment 1830a, the first segment 1830a may rotate in the first rotational direction 1860 until the protrusion 1905 engages with the recess 1910. The engagement of the protrusion 1905 with the recess 1910 forms a lock to substantially prevent the plurality of segments 1830 from freely rotating about the respective plurality of hinged joints 1835 and become extended.

The protrusion 1905 may be disengaged from the recess 1910 in response to a mechanical pull force being applied to the extension unit 1804. In particular, the pull force F may be applied proximate the second hinged joint 1835b to cause the further end of the second side 1825 of the body 1802 of the stand 1800 to flex enough to release the protrusion 1905 from the recess 1910.

It will be understood by those of ordinary skill in the art that the locking mechanism may comprise any other fastening technique known in the art. For example, the locking mechanism may include more than one protrusion or even more than one recess that engages with the protrusions.

Figure 22:
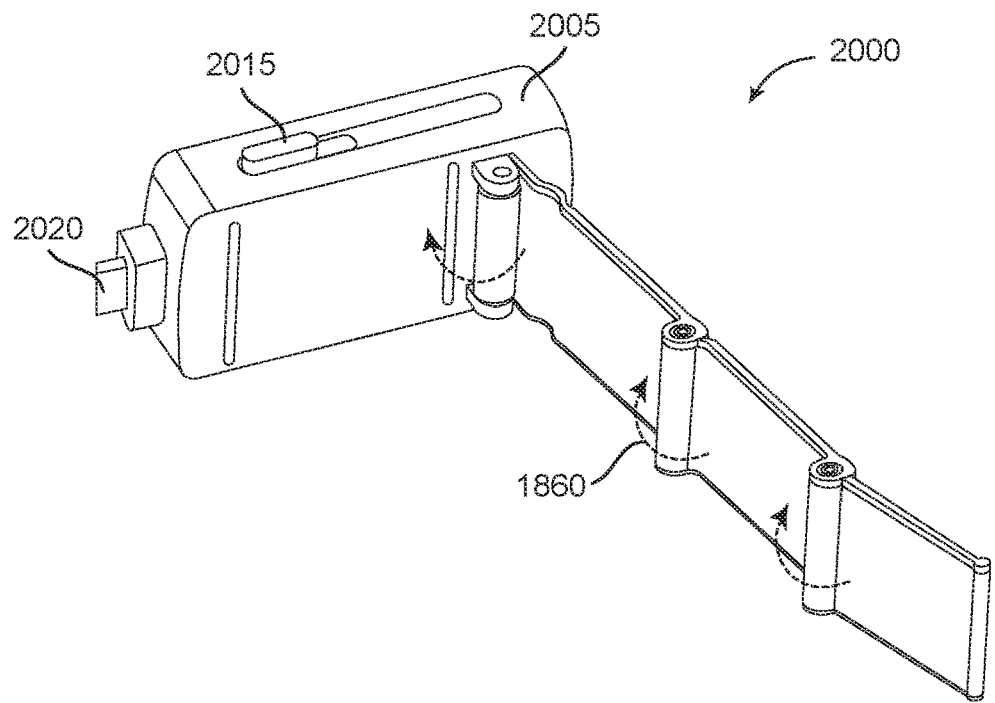
FIGS. 22-23 are three dimensional illustrations of the integrated stand having an extension unit in an unfolded position, according to one illustrated embodiment.
Figure 23:
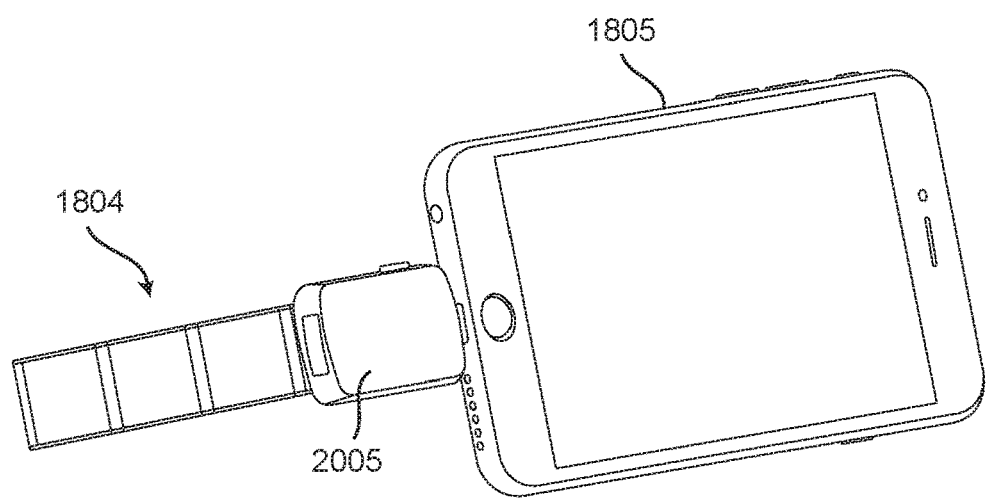

FIGS. 20A-20E show illustrations of several views of an integrated stand 2000, while FIGS. 22-23 show three dimensional illustrations of the integrated stand 2000 having the extension unit 1804 in an unfolded position, according to one illustrated embodiment.

The integrated stand 2000 may comprise a storage device 2005 configured to store data therein, at least one connector 2020, 2025 to allow for data transmission between the storage device 2005 and the portable device 1805, an actuator 2015 to cause the at least one connector 2020, 2025 to be extruded from the storage device 2005, and the extension unit 1804 integrated with a bottom side of the storage device 2005.

As discussed above, the storage device 2005 may, for example, be a flash drive (e.g., c20i flash drive product by Lexar) or USB thumb drive. As illustrated in FIG. 23, it may be advantageous to couple the storage device 2005 to the portable device 1805 such that data embedded within the storage device 2005 may be accessed via the portable device 1805. The storage device 2005 may be coupled to the portable device 1805 via the at least one connector 2020, 2025. The at least one connector may, for example, be at least one of a lightning cable connector 2020 or a USB cable connector 2025 embedded within the storage device 2005.

The storage device 2005 comprises a front end 2030 opposed a back end 2035. The front end 2030 and back end 2035 of the storage device 2005 may be configured to have the at least one connector 2020, 2025 extruded therethrough. The extruded connector 2020, 2025 may be coupled to the portable device 1805, as illustrated in FIG. 23. In particular, the at least one connector 2020, 2025 may engage with a connector port positioned at the edge of the portable device 1805. Engaging at the edge of the portable device 1805 allows the extended plurality of segments 1830 to provide balance at the edge of the portable device 1805.

The extension unit 1804 may be rotatively coupled about the first hinged joint 1835a positioned proximate the bottom side of the storage device 2005. The plurality of segments 1830 may be in a folded position in response to rotation about the respective hinged joints 1835 in the first direction 1860. Additionally, the plurality of segments 1830 may be in the extended position in response to rotation about the respective hinged joints 1835 in the second direction 1850. In one embodiment, the extension unit 1804 rotatively coupled proximate the storage device 2005 may employ the locking mechanism described above.

Figure 21A:
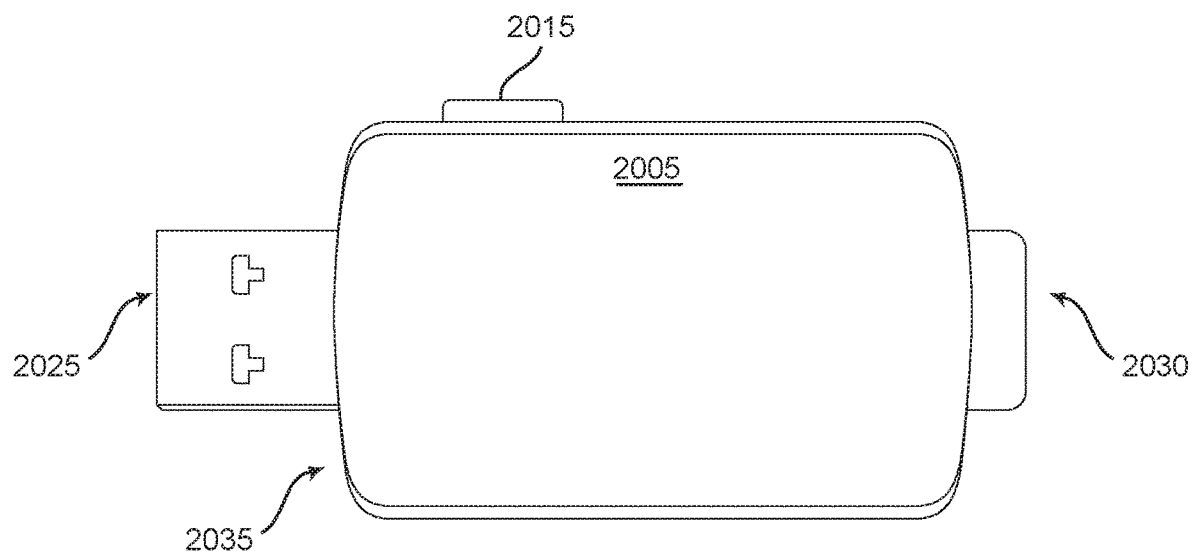
FIGS. 21A-21B are illustrations of an actuator operable to cause at least one connector to protrude from a storage device, according to one embodiment.
Figure 21B:
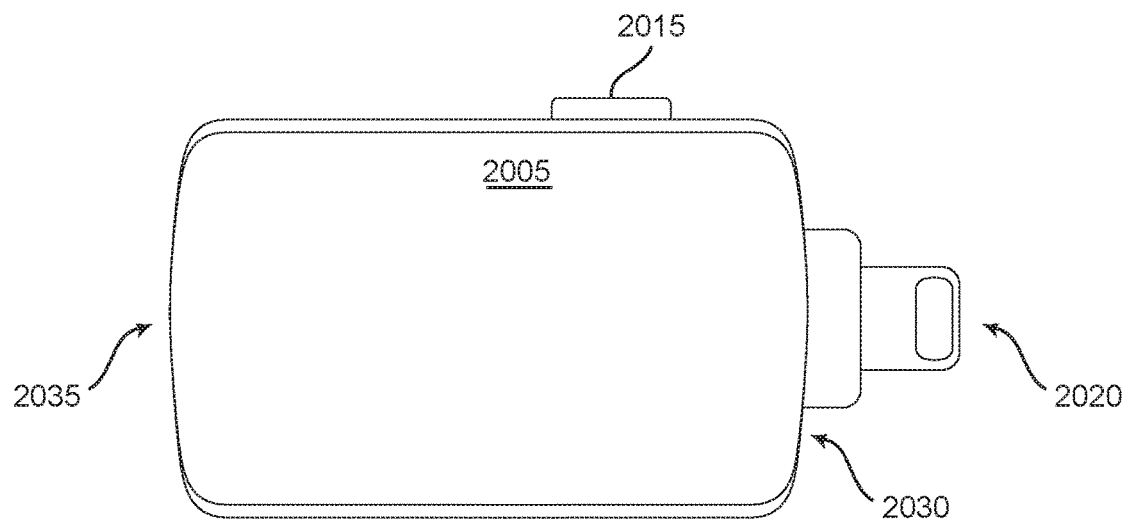

FIGS. 21A-21B show illustrations of the actuator 2015 causing protrusion of the at least one connector 2020, 2025, while FIGS. 22-23 show illustrations of the integrated stand 2000 with the extruded connector 2020, 2025 and unfolded extension unit 1805, according to one illustrated embodiment.

The actuator 2015 may be a mechanical slider coupled to the at least one connector 2020, 2025. A user may cause the actuator 2015 to slide and extrude the at least one connector 2020, 2025 from the front end 2030 or the back end 2035. For example, in response to the actuator 2015 being shifted toward the back end 2035 of the storage device 2005, the extruded connector 2025 (e.g., USB connector) is extruded through the back end 2035. On the other hand, in response to actuator 2015 sliding toward the front end 2030 of the storage device 2005, the extruded connector 2020 (e.g., lightening connector) is extruded through the front end 2030. As illustrated in FIG. 23, the extruded connector 2020 may engage with the connection port at the edge of the portable device 1805. Engaging at the edge of the portable device 1805 allows for the extended plurality of segments 1830 to balance the portable device 1805 from the edge. As discussed above, the plurality of segments 1830 rotatively coupled about the respective plurality of hinged joints 1835 may be at least partially unfolded to balance various sizes of portable devices 1805.

Having described some embodiments of the invention, additional embodiments will become apparent to those skilled in the art to which it pertains. Specifically, although reference was made throughout the specification and drawings to the stand 1800 being coupled to a connection cable, including a connector housing such as a lightening connector or USB connector, it will be appreciated that the stand 1800 may also be coupleable to other connector types, such as, storage devices including a connector housing such as, micro-USB, USB type B, USB type C, or serial port to name a few. The embodiment describing and illustrating the stand 1800 coupled to the lightening connector housing was merely to convey the functionality and various aspects of the stand 1800 when being leveraged to balance an iphone or ipad product. Of course, embodiments described above are not limited to APPLE products and are applicable to any portable device on the market.

The dimensions, configurations, and angles shown are meant as examples only, and not meant to be limiting in any way.

"Connection cable" refers to any cable or cord, such as a charging cable or a connector to a storage device (e.g., flash drive) where there is a plug housing on at least one end of the connection cable.

"Storage device" refers to any device that is configured to store data or charge therein. The storage device may be disposed within the plug housing of the "connection cable," Additionally, the storage device may be an external charger configured to charge a portable device.

"Integrated stand" refers to the combination of the extension unit 1804 with the storage device. As discussed above, the extension unit 1804 is effectively integrated with the storage device by being rotatively coupleable about the first hinged joint 1835a.

"Extension unit" refers to the plurality of segments 1830 that are foldable and extendable about the respective hinged joints 1835. Although multiple segments is disclosed and illustrated herein, it will be appreciated that an extension unit having a single segment, for example having only the first segment 1830a, is well within the scope of embodiments described herein. It will be noted that having multiple segments is advantageous in providing balancing to portable devices of variable sizes.

Various different "locking mechanism" schemes are within the scope of the embodiments described above and are not limited to any specific locking mechanism scheme found in the above description and drawings. For example, the locking mechanism may comprise multiple protrusions and/or multiple recesses. Additionally, a loop and fastener system (e.g., VELCRO-type loop and fastener) as well as a locking system employing magnets or even a latch system are well within the scope of embodiments described above. Furthermore, the locking mechanism may be applicable to all embodiments of the invention described herein and not limited to a particular embodiment.

Additionally, various different schemes of the actuator 2015 are within the scope of the embodiments described above and are not limited to a mechanical slider scheme described above. For example, the actuator 2015 may be a push-button rather than a slider, or even an electronic configuration such as a touch sensor, electric switch, or any other electrical configuration to cause the at least one connector to protrude from the storage device.

While the particular methods, devices and systems described herein and described in detail are fully capable of attaining the above-described objects and advantages of embodiments of the invention, it is to be understood that these are example embodiments of the invention and are thus representative of the subject matter which is broadly contemplated by the present disclosure, that the scope of the present disclosure fully encompasses other embodiments which may become obvious to those skilled in the art, and that the scope of the present disclosure is accordingly to be limited by nothing other than the appended claims, in which reference to an element in the singular means "one or more" and not "one and only one", unless otherwise so recited in the claim.

It will be appreciated that modifications and variations of embodiments of the invention are covered by the above teachings and within the purview of the appended claims without departing from the spirit and intended scope of embodiments of the invention.

What is claimed is:

1. A stand for a portable device, comprising:
   a body having a top side opposed a bottom side, the bottom side forming receptacle sized to receive therein a plug housing to be at least partially encapsulated by the receptacle, wherein when a plug of the plug housing is enaged with the portable device, a first end of the top side of the body is proximate to the portable device and a second end of the top side opposite the first end of the top side is distal from the portable device, and wherein the bottom side further comprises a channel through a surface of the bottom side to the receptacle and extending a length of the receptacle, wherein a width of the channel is less than a width of the receptacle and is sized to permit a connection cable coupled to the plug housing to pass through the channel but retain the plug housing in the receptacle;
   a first segments having a first end opposite a second end, the first end of the first segment rotatively coupled around a hinged joint positioned along the first end of the top side of the body; and
   a second segment rotatively coupled around a further hinged joint positioned along the second end of the first segment.

2. The stand of claim 1 wherein the first and second segments are foldably stored within the top side of the body in response to being rotated around the first and second hinged joints, respectively.

3. The stand of claim 2, further comprising:
   a protrusion extending from the second end of the first segment; and
   a recess through a portion of the second end of the top side of the body, wherein the recess is configured to engage with the protrusion in response to the first and second segments being foldably stored within the top side of the body.

4. The stand of claim 3, wherein the folded first and second segments are locked within the top side of the body in response to the protrusion being engaged with the recess.

5. The stand of claim 4, wherein the locked first and second segments within the top side of the body are released in response to the protrusion being disengaged from the recess.

6. The stand of claim 5, wherein the protrusion is disengaged from the recess in response to the body flexing by applying at least a mechanical pull force to the second end of the first segment to cause the first segment to rotate around the first hinged joint.

7. The stand of claim 1, wherein the first and second segments are unfolded around the first and second hinged joints, respectively, to provide balance to the portable device.

8. The stand of claim 7, wherein the plug housing encapsulates at least a portion of the connection cable.

9. The stand of claim 1, wherein when the plug is engaged with the portable device the unfolded first and second segments provide balance at the edge of the portable device.

10. The stand of claim 8, wherein the connection cable comprises a charging cable.

11. A stand for a portable device, comprising:
    a body having a top side opposed a bottom side, the bottom side forming a receptacle sized to receive therein a plug housing to be at least partially encapsulated by the receptacle, wherein the bottom side further comprises a channel through a surface of the bottom side to the receptacle and extending a length of the receptacle, wherein a width of the channel is less than a width of the receptacle and is sized to permit a connection cable coupled to the plug housing to pass through the channel but retain the plug housing in the receptacle;
    a segment having a first end opposite a second end, the first end of the segment rotatively coupled around a hinged joint positioned along a first end of the top side of the body;

a protrusion extending from the second end of the segment; and a recess through a portion of a second end of the top side of the body, the second end of the top side of the bod opposite the first end of the topside of the body. wherein the protrusion engages with the recess in response to the segment being foldably stored within the top side of the body.

12. The stand of claim 11, wherein the segment is foldably stored within the top side of the body in response to the segment rotating about the hinged joint in a first rotational direction.

13. The stand of claim 11, wherein the segment foldably stored within the top side of the body is unfolded in response to the protrusion being disengaged from the recess.

14. The stand of claim 13, wherein the protrusion is disengaged from the recess in response to the segment rotating about the hinged joint in a second rotational direction opposite the first rotational direction.

15. The stand of claim 14, wherein the segment is unfolded around the hinged joint to provide balance to the portable device.

16. The stand of claim 15, wherein the plug housing encapsulates at least a portion of the connection cable, wherein when the at least portion of the connection is engaged to an edge of the portable device, the unfolded first and second segments provide balance at the edge of the portable device.

* * * * *